(12) United States Patent
Iwashita et al.

(10) Patent No.: US 7,190,567 B2
(45) Date of Patent: Mar. 13, 2007

(54) CAPACITOR AND ITS MANUFACTURING METHOD, AND SEMICONDUCTOR DEVICE

(75) Inventors: Setsuya Iwashita, Nirasaki (JP); Motohisa Noguchi, Suwa (JP); Hiromu Miyazawa, Toyoshina-machi (JP); Takamitsu Higuchi, Hatsumoto (JP)

(73) Assignee: Seiko Epson Corporation (JP)

( * ) Notice: Subject to any disclaimer, the term of this patent is extended or adjusted under 35 U.S.C. 154(b) by 48 days.

(21) Appl. No.: 11/004,591

(22) Filed: Dec. 3, 2004

(65) Prior Publication Data

US 2005/0128681 A1 Jun. 16, 2005

(30) Foreign Application Priority Data

Dec. 4, 2003 (JP) ............................. 2003-405654

(51) Int. Cl.
*H01G 4/06* (2006.01)
(52) U.S. Cl. ................ 361/311; 361/321.1; 361/321.5; 361/313; 361/306.1; 361/306.3; 257/295; 257/296

(58) Field of Classification Search ............. 361/321.1, 361/321.2, 311–313, 306.1, 306.2, 306.3, 361/321.5; 257/295–296; 438/96–97
See application file for complete search history.

(56) References Cited

U.S. PATENT DOCUMENTS

| 4,870,539 A | * | 9/1989 | Chance et al. ........... 361/321.5 |
| 6,340,832 B2 | * | 1/2002 | Kasahara ..................... 257/532 |

FOREIGN PATENT DOCUMENTS

| JP | 05-047587 | 2/1993 |
| JP | 05-082801 | 4/1993 |
| JP | 07-226485 | 8/1995 |
| JP | 09-139480 | 5/1997 |
| JP | 09-148538 | 6/1997 |
| JP | 11-274671 | 10/1999 |
| JP | 11-297947 | 10/1999 |
| JP | 11-344804 | 12/1999 |
| JP | 2002-016234 | 1/2002 |

* cited by examiner

*Primary Examiner*—Nguyen T. Ha
(74) *Attorney, Agent, or Firm*—Harness, Dickey & Pierce, P.L.C.

(57) ABSTRACT

A capacitor is provided having a structure in which an insulation film is interposed between a first electrode and a second electrode. The insulation film includes $SrTiO_3$ as a main component, and at least one of Si and Ge added thereto.

4 Claims, 4 Drawing Sheets

CAPACITOR AND ITS MANUFACTURING METHOD, AND SEMICONDUCTOR DEVICE

RELATED APPLICATIONS

This application claims priority to Japanese Patent Application No. 2003-405654 filed Dec. 4, 2003 which is hereby expressly incorporated by reference herein in its entirety.

BACKGROUND

1. Technical Field

The present invention relates to a capacitor and its manufacturing method, and a semiconductor device equipped with the capacitor.

2. Related Art

Various kinds of capacitors are used in semiconductor devices as their constituting elements (see, for example, Japanese Laid-open Patent Application HEI 7-226485, Japanese Laid-open Patent Application HEI 9-139480, Japanese Laid-open Patent Application HEI 5-82801, and Japanese Laid-open Patent Application HEI 5-47587Patent). For example, capacitors are used in oscillation circuits, power supply circuits and the like in semiconductor devices for the purpose of prevention, stabilization and smoothing of oscillations of operation amplifiers, for voltage step-up circuits, and the like.

Such capacitors often use a structure, in the case where they are fabricated inside circuits, in which an insulation film (dielectric film), such as, a silicon oxide film, silicon nitride film, silicon oxinitride film or the like is sandwiched between upper and lower electrode films composed of silicon or metal, or titanium nitride, aluminum nitride or the like. Also, in the case where they are attached externally to circuits or the like, capacitors such as laminated capacitors equipped with ceramics insulation films (dielectric films), such as, barium titanate films or the like are known.

When such capacitors are fabricated, in particular, when their insulation films are formed, a sputter method, a CVD method, a laser ablation method or the like is normally employed.

It is noted that the capacity of a capacitor is in proportion to the dielectric constant and area of an insulation film (dielectric film) thereof, and in reverse proportion to the thickness of the insulation film. Accordingly, when capacitors of a small size and high capacity are desired to be formed inside circuits, their insulation films (dielectric films) may preferably be formed from a material having a high dielectric constant in view of leak current, to thereby achieve a high capacity. On the other hand, when capacitors are externally mounted, it is desirous if they can be readily fabricated with thin films as there are demands to lower assembly costs, and improve the yield.

Under such circumferences, the dielectric constant of an insulation film (dielectric film) of a capacitor may preferably be 300 or greater in the case of internal circuits, and 1000 or greater in the case of externally attached type, in consideration of its area and film thickness.

However, the capacitor fabricated inside the circuit described above uses a silicon oxide film, a silicon nitride film, or a silicon oxinitride film as an insulation film, and these insulation films (dielectric films) have low dielectric constants, which are 10 or less. Accordingly, it may be necessary to increase its area to increase its capacity. However, when the area of the capacitor is increased, an area occupied by the capacitor in the circuit becomes larger, which prevents miniaturization of the circuit.

As insulation materials having a high dielectric constant, ferroelectric materials, such as, for example, lead zirconate titanate (PZT), barium titanate and the like are known. Film forming temperature for those ferroelectric materials needs to be 450° C. or less in view of its influence to other semiconductor elements and wirings provided in the same semiconductor device. However, because crystallization is difficult to take place at such a low temperature, the resultant ferroelectric film obtained may not attain a desired level of high dielectric constant, although it may have a relatively high dielectric constant compared to silicon oxide films. Also, the dielectric constant changes greatly against changes in frequency and temperature, and therefore the ferroelectric film may be inferior compared to silicon oxide films.

Also, in the method for manufacturing such capacitors, in particular, because their insulation films are formed by a sputter method, a CVD method, a laser ablation method or the like, there are problems in that a large scale film forming apparatus is necessary, which requires a high initial cost, and a large amount of energy is necessary for film formation, which requires a high running cost. Also, when patterning is conducted by etching after film formation, there are problems in that the material usage efficiency is poor, and photolithography masks and chemicals for etchings are necessary, which result in a higher cost, and the number of steps increases, which lowers the productivity.

On the other hand, when capacitors composed of ceramics such as barium titanate or the like that are externally mounted are formed, although the cost of the capacitors themselves may be lowered, the assembly cost is required for positioning at the time of external mounting, bonding with other elements and the like, and there are problems in the yield, such that a sufficient cost reduction has not been achieved.

Also, piezoelectric elements having insulation films of PZT or the like that include Pb in their compositions may possibly become a source of environmental pollution as Pb is a toxic substance, such that reconsideration of the production of piezoelectric elements using this material would be driven in future by necessity.

The present invention has been made in view of the problems described above, and its object is to provide a capacitor that has an insulation layer of a high dielectric constant and does not contain Pb, which can therefore make it possible to reduce the size of a device having the same, and which is environmentally advantageous, a method for manufacturing a capacitor which makes it possible to manufacture the capacitor at a low cost, and a semiconductor device equipped with the capacitor.

SUMMARY

A capacitor in accordance with the present invention that achieves the aforementioned object pertains to a capacitor having a structure in which an insulation film is interposed between a first electrode and a second electrode, and is characterized in that the insulation film includes $SrTiO_3$ as a main component, and at least one of Si and Ge added thereto.

In this capacitor, the insulation film having $SrTiO_3$ as a main component has a relatively high dielectric constant, and therefore a device equipped with the same can be miniaturized. Also, because $SrTiO_3$ does not have a phase change at temperatures at which capacitors are normally used, for example, from minus (−) several tens ° C. to plus (+) one hundred and several tens ° C., its dielectric constant has few fluctuations, and therefore it is highly reliable and can be stably operated. Furthermore, because its insulation film does not contain Pb, it is advantageous against environmental pollution.

Also, because its insulation film contains at least one of Si and Ge added thereto, the sintering temperature at the time of forming the insulation film becomes lower as Si or Ge acts as catalyst. Accordingly, when a substrate on which the capacitor is to be formed includes, for example, other semiconductor elements and wirings formed thereon, thermal influences to these elements can be minimized.

Also, in the capacitor described above, the total amount of Si and Ge added may preferably be 0.1 mol % or greater but 10.0 mol % or less.

When the total amount of Si and/or Ge added is less than 0.1 mol %, the action of Si and/or Ge as catalyst is not well demonstrated, and when it exceeds 10.0 mol %, the amount of $SrTiO_3$ reduces relatively, and the dielectric constant thus lowers.

Also, in the capacitor described above, the insulation film may preferably be in an amorphous phase or a mixed state of an amorphous phase and a crystal phase.

Due to the fact that its phase has an amorphous phase, the insulation film is formed by sintering at relatively low temperatures. Accordingly, for example, when the substrate contains other semiconductor elements and wirings formed thereon, thermal influences thereon can be minimized.

Also, in the capacitor described above, the insulation film may preferably be composed of a mixed state of an amorphous phase and a crystal phase, wherein the crystal phase may preferably be formed in a state of being discontinuous and not in a state of being continuous between the first electrode and the second electrode.

By so doing, due to the fact that the crystal phase is formed in a state of being discontinuous between the first electrode and the second electrode, the insulation film does not have such a hysteresis as that of ferroelectric in its polarization-voltage relation, and accordingly, its behavior can be readily controlled, designing of a circuit incorporating the same becomes easier, and energy loss is reduced.

A method for manufacturing a capacitor in accordance with the present invention pertains to a method for manufacturing a capacitor having a structure in which an insulation film is interposed between a first electrode and a second electrode, and is characterized in comprising: a step of forming the first electrode on a substrate; a step of depositing a liquid including precursor compounds of an insulation material including $SrTiO_3$ as a main component and at least one of Si and Ge added thereto on the first electrode by a droplet discharge method; and a step of forming the insulation material including $SrTiO_3$ as a main component and at least one of Si and Ge added thereto by applying a heat treatment to the liquid including the precursor compounds.

By the method for manufacturing a capacitor, an insulation film having a high dielectric constant, which is composed of $SrTiO_3$ as a main component and at least one of Si and Ge added thereto, can be formed, and therefore a device equipped with a capacitor having the insulation film can be miniaturized. Also, because $SrTiO_3$ does not have a phase change at temperatures at which capacitors are normally used, for example, from minus (−) several tens ° C. to plus (+) one hundred and several tens ° C., its dielectric constant has few fluctuations, and therefore the capacitor obtained is highly reliable and can be stably operated. Furthermore, because its insulation film does not contain Pb, it is advantageous against environmental pollution, and therefore the capacitor obtained through manufacturing a capacitor equipped with the same becomes also environmentally advantageous.

Also, because its insulation film contains at least one of Si and Ge added thereto, the sintering temperature at the time of forming the insulation film becomes lower as Si or Ge acts as catalyst. Accordingly, when a substrate on which the capacitor is to be formed includes, for example, other semiconductor elements and wirings formed thereon, thermal influences thereon can be minimized.

Furthermore, due to the fact that the liquid is deposited by a droplet discharge method, and the same is thermally treated to form an insulation film, a large-scale film forming apparatus is not required, and the method is advantageous also in material usage efficiency and energy consumption, such that the cost can be reduced. Moreover, because patterning by etching is not required as the liquid can be deposited at any desired positions, there is no damage to the insulation film, which may be caused by etching.

Also, the method for manufacturing a capacitor described above may preferably be equipped with a step of forming a self-organizing film using fluoroalkylsilane on a surface of the substrate and the first electrode, before the step of depositing the liquid including precursor compounds on the first electrode by the droplet discharge method.

By so doing, a liquid-repelling section composed of fluoroalkylsilane is formed on the substrate surface around the first electrode, and therefore when the liquid is deposited on the first electrode, the liquid is prevented from wet-spreading from the first electrode to its surrounding area. Accordingly, an insulation film in a desired configuration can be readily formed on the first electrode.

Also, in this case, a step of irradiating light on the fluoroalkylsilane formed on the surface of the first electrode may preferably be included, after the step of forming the self-organizing film using fluoroalkylsilane on the surface of the substrate and the first electrode.

By so doing, the fluoroalkylsilane formed on the surface of the first electrode becomes lyophilic upon receiving the irradiated light, and therefore the surface of the first electrode becomes lyophilic, such that the first electrode is wetted well with the liquid, and the insulation film can be readily formed on the first electrode.

Also, in the method for manufacturing a capacitor described above, in the step of forming the insulation film by conducting the heat treatment on the liquid, the temperature of the heat treatment may preferably be at 450° C. or less.

By so doing, when the substrate includes, for example, other semiconductor elements and wirings, thermal influences thereon can be reduced.

Also, in the method for manufacturing a capacitor described above, the first electrode may preferably be formed by: a step of depositing a first liquid having first metal fine particles dispersed in a first dispersion medium on the substrate by a liquid discharge method; a step of removing the first dispersion medium by applying a heat treatment to the first liquid; and a step of sintering the first metal fine particles.

By so doing, because the first electrode is also formed through depositing the liquid by a liquid discharge method, and thermally treating the same, a large-scale film forming apparatus is not necessary, and it is also advantageous in material usage efficiency and energy consumption, such that the cost can be reduced.

Also, in the method for manufacturing a capacitor described above, the second electrode may preferably be formed by: a step of depositing a second liquid having second metal fine particles dispersed in a second dispersion medium on the substrate by a liquid discharge method; a step of removing the second dispersion medium by applying a heat treatment to the second liquid; and a step of sintering the second metal fine particles.

By so doing, because the second electrode is also formed through depositing the liquid by a liquid discharge method, and thermally treating the same, a large-scale film forming apparatus is not necessary, and it is also advantageous in material usage efficiency and energy consumption, such that the cost can be reduced.

Also, in the method for manufacturing a capacitor described above, the first metal fine particles may preferably be fine particles composed of at least one of platinum, iridium, ruthenium, gold and silver, and the temperature of the heat treatment for sintering the first metal particles may preferably be 400° C. or less. Furthermore, the second metal fine particles may preferably be fine particles composed of at least one of platinum, iridium, ruthenium, gold and silver, and the temperature of the heat treatment for sintering the first metal particles may preferably be 400° C. or less.

By so doing, electrodes composed of metal films that are of a low resistance, difficult to oxidize and stable can be formed. Also, because the heat treatment temperature is set to 400° C. or less, when the substrate includes, for example, other semiconductor elements and wirings, thermal influences thereon can be reduced.

A semiconductor device in accordance with the present invention is characterized in comprising the capacitor described above, or comprising a capacitor obtained by the manufacturing method described above.

Because the semiconductor device is equipped with a capacitor that is reduced in size through providing an insulation film of a high dielectric constant, the semiconductor device itself can also be reduced in size.

Also, in particular, when the insulation film is formed by using a liquid discharge method, the cost can be reduced.

Furthermore, because the insulation film of the capacitor does not contain Pb, it is advantageous against environmental pollution, and therefore the semiconductor device itself equipped with the same also becomes environmentally advantageous.

DETAILED DESCRIPTION

The present invention is described below in detail.

Figure 1:
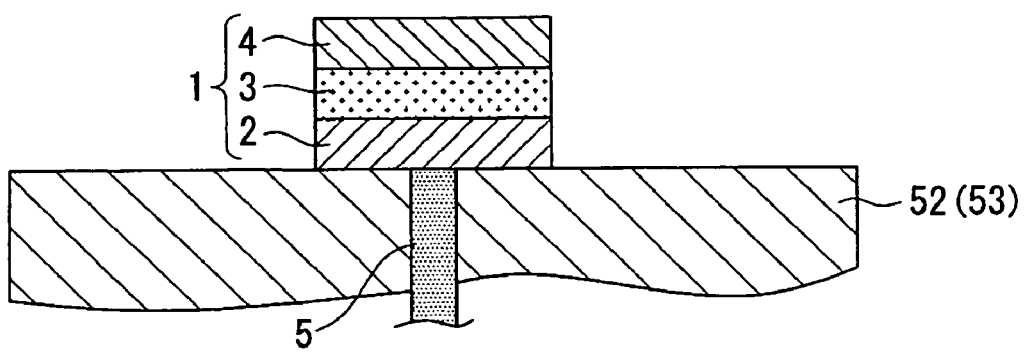
FIG. 1 is a side cross-sectional view of a capacitor in accordance with an embodiment of the present invention.
Figure 2:
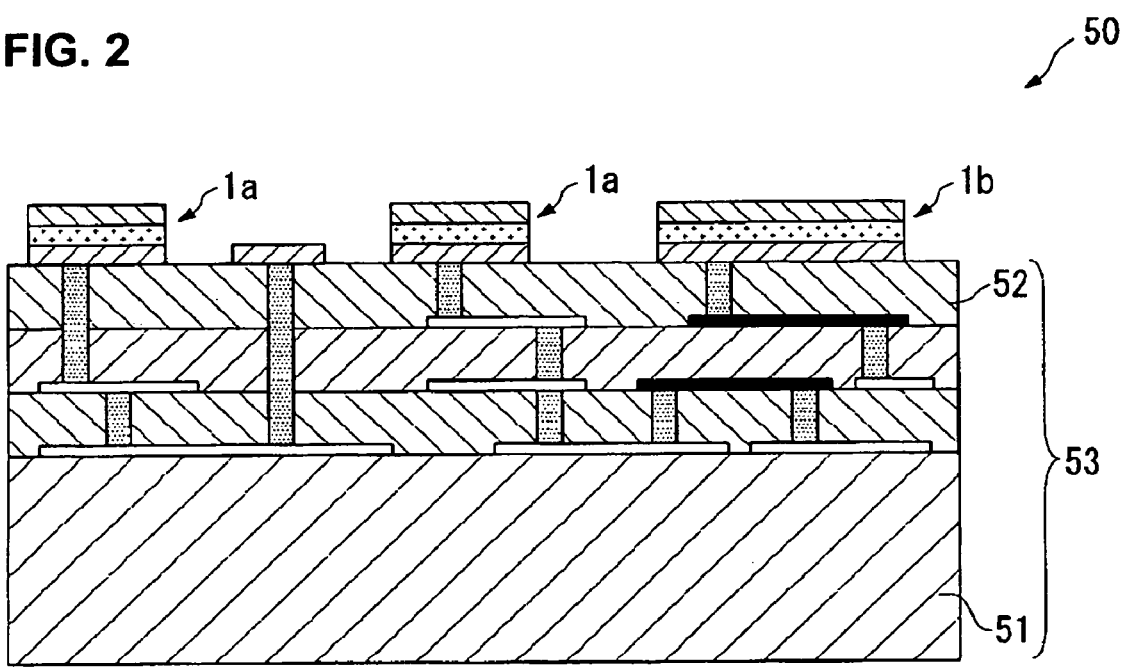
FIG. 2 is a side cross-sectional view of a semiconductor device in accordance with an embodiment of the present invention.

FIG. 1 is a view indicating a capacitor in accordance with an embodiment of the present invention, wherein reference numeral 1 in FIG. 1 denotes a capacitor. The capacitor 1 can be used, for example, in a semiconductor device 50 that is a semiconductor device in accordance with an embodiment of the present invention shown in FIG. 2, as a capacitor 1a that can be replaced with a conventional in-circuit capacitor, and also as a capacitor 1b that can be replaced with a capacitor attached externally to the circuit.

It is noted here that the semiconductor device 50 includes various transistors such as CMOS transistors and memory elements formed over a base substrate 51, and various wirings and plugs for connecting them and electrically connecting the capacitors 1a and 1b formed on interlayer dielectric films or in the interlayer dielectric films. It is noted that a portion up to the interlayer dielectric film 52 that defines a groundwork for forming the capacitors 1a and 1b may be referred to as a substrate 53 in the present invention. Further, although not shown, protection layers and wirings may be formed over the capacitors 1a and 1b, and an insulation layer that covers them may be further formed.

A capacitor 1 used as either the capacitor 1a or 1b is formed on an interlayer dielectric film 52 (substrate 53) composed of, for example, polyimide, as shown in FIG. 1, and is formed from a first electrode 2 formed on the interlayer dielectric film 52, an insulation film 3 formed on the first electrode 2, and a second electrode 4 formed on the insulation film 3. In other words, the capacitor 1 has a structure in which the insulation film 3 is sandwiched between the first electrode 2 and the second electrode 4, and the first electrode 2 is connected to an embedded wiring 5 that is formed in the interlayer dielectric film 52, and the second electrode 4 is connected to another wiring (not shown).

The first electrode 2 and the second electrode 4 are both formed from metal sintered compacts that are composed of sintered metal fine particles. More specifically, they are formed from fine particles of at least one of platinum, iridium, ruthenium, gold and silver, which are sintered.

The insulation film 3 is formed from $SrTiO_3$ contained as a main component, and at least one of Si and Ge added thereto. It is noted here that, in the present invention, the aforementioned "main component" is permitted to contain some impurities other than Si and Ge, and means that the entire film is occupied by $SrTiO_3$ by 50 mol % or more. The insulation film 3 has a high dielectric constant compared to that of other insulation films (dielectric films), such as, for example, a silicon oxide film, a silicon nitride film, a silicon oxinitride film or the like. Accordingly, the capacitor 1 having this film can have a higher capacity compared to a conventional type, and can be made smaller when it is designed to have the same capacity as that of a conventional type.

The insulation film 3 includes at least one of Si and Ge added as compositions other than the main composition of $SrTiO_3$. Si and/or Ge may preferably be added in the insulation film 3 in the sum (the total amount) of 0.1 mol % or greater but 10.0 mol % or less, more preferably, 0.5 mol % or greater but 8.0 mol % or less, and even more preferably, 1.0 mol % or greater but 5.0 mol % or less. When Si and/or Ge is added in such a total adding amount, Si and/or Ge acts as catalyst when a precursor material of the insulation film 3 is sintered to form an oxide containing $SrTiO_3$ as a main composition, as described below. In other words, by the catalytic action, a crystal layer of $SrTiO_3$ can be formed even at a low sintering temperature, and therefore a high dielectric constant can be obtained. Also, because the sintering temperature can be set at a lower temperature, thermal influences on other semiconductor elements (CMOS or the like) and wirings on the substrate 53 can be minimized.

It is noted that, if the total amount of Si and/or Ge added is less than 0.1 mol %, the action of Si and/or Ge as catalyst is not well demonstrated, and when it exceeds 10.0 mol %, the amount of $SrTiO_3$ reduces relatively, and the dielectric constant thus lowers. Also, in order to have the catalytic action of Si and/or Ge well demonstrated and not to lower the dielectric constant, the adding amount may preferably be 0.5 mol % or greater but 8.0 mol % or less, and even more preferably, 1.0 mol % or greater but 5.0 mol % or less.

As described below, when precursor materials of the insulation film 3 are sintered to form an oxide (insulation film 3) containing $SrTiO_3$ as a main composition, the obtained insulation film 3 would likely have an amorphous phase or a mixed phase (mixed state) of an amorphous phase and a crystal phase, in particular, would likely have a mixed phase having a crystal phase due to the addition of Si and Ge as described above.

In this manner, the insulation film 3, as having the phase including an amorphous phase, is formed by sintering at a relatively low temperature. Accordingly, thermal influences on other semiconductor elements (CMOS and the like) and wirings on the substrate 53 are few, as described above.

Also, when the insulation film 3 is in a mixed phase having a crystal phase, the crystal phase may preferably be formed in a state of being discontinuous and not in a state of being continuous between the first electrode 2 and the second electrode 4. When the crystal phase is formed in a state of being discontinuous between the first electrode 2 and the second electrode 4, the insulation film 3 does not have a hysteresis as that of ferroelectric in its polarization-voltage relation. Accordingly, its behavior can be readily controlled, designing of a circuit incorporating the same becomes easier, and energy loss is reduced.

Next, a method for manufacturing a capacitor in accordance with an embodiment of the present invention is described based on the method for manufacturing the capacitor 1 with the structure described above. It is noted that the present embodiment is described with reference to an example in which the method for manufacturing a capacitor in accordance with the present invention is applied to manufacture of the capacitor 1 (1a, 1b) in the semiconductor device 50 shown in FIG. 2.

Also, in the present invention, a droplet discharge method refers to a method of forming desired patterns on a substrate by jetting droplets of liquid in the desired patterns, and generally refers to an ink jet method. It is noted that the liquid (droplets) jetted is not a so-called ink used for printed matters, but a liquid that may include various material substances composing each device, and more specifically, substances that can function as a conductive substance or an insulating substance can be enumerated as the material substances.

Figure 3:
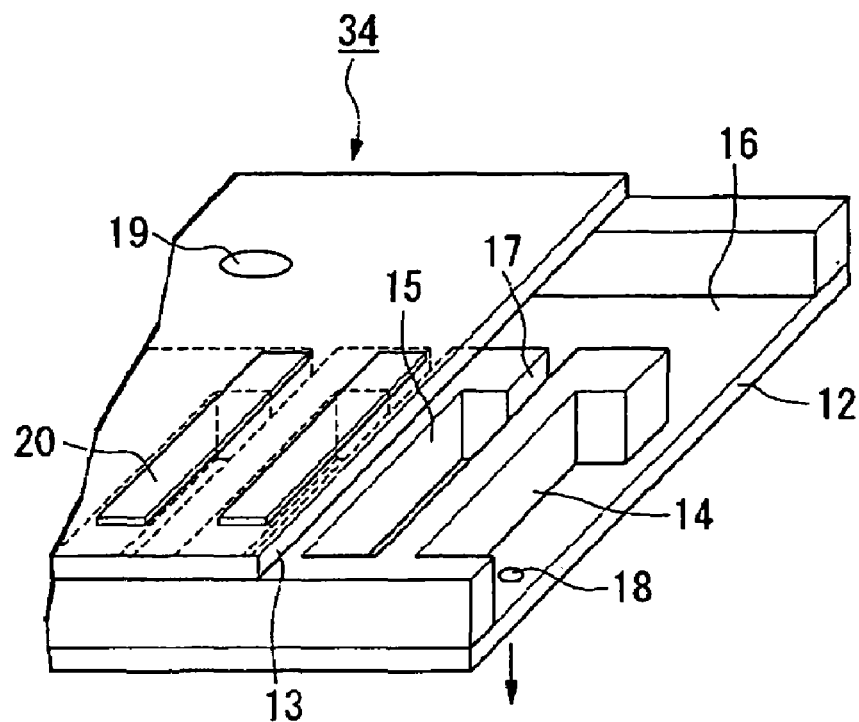
FIG. 3(a) is a perspective view of a main portion of a discharge head and FIG. 3(b) is a side cross-sectional view of the main portion.
Figure 3:
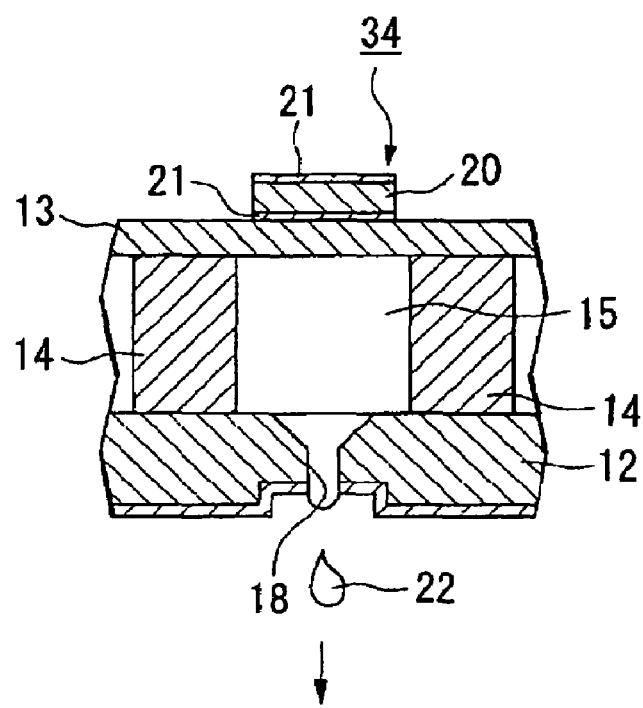

First, prior to concrete descriptions of the method for manufacturing the capacitor 1, one example of a discharge head used in the droplet discharge method is described. As shown in FIGS. 3(a) and 3(b), a discharge head 34 is equipped with a nozzle plate 12 of stainless steel, for example, and a vibration plate 13, which are bonded together through partition members (reservoir plates) 14. A plurality of cavities 15 and a reservoir 16 are formed by the partition members 14 between the nozzle plate 12 and the vibration plate 13, and the cavities 15 and the reservoir 16 communicate with one another through flow paths 17.

Each of the cavities 15 and the reservoir 16 are filled with liquid, and the flow paths 17 function as supply ports for supplying the liquid from the reservoir 16 to the cavities 15. Also, the nozzle plate 12 is provided with a plurality of nozzles 18 regularly arranged in length and breadth directions each in the form of a hole for jetting the liquid. On the other hand, the vibration plate 13 is provided with a hole 19 that opens to the reservoir 16, wherein the hole 19 is connected to a liquid tank (not shown) through a tube (not shown).

Also, a piezoelectric element (piezoelectric device) 20 is bonded to a surface of the vibration plate 13 on the opposite side of a surface thereof facing the cavity 15, as shown in FIG. 3(b). The piezoelectric element 20 is sandwiched between a pair of electrodes 21 and 21, and is formed to flex and protrude outwardly when it is energized.

The vibration plate 13 having the piezoelectric element 20 having such a structure bonded thereto flexes outwardly with the piezoelectric element 20 at the same time, thereby increasing the volume of the cavity 15. Then, as the cavity 15 is communicated with the reservoir 16, and when the liquid is filled in the reservoir 16, the liquid in an amount corresponding to an increased volume flows into the cavity 15 from the reservoir 16 through the flow path 17.

Then, when the piezoelectric element 20 is released from being energized from this state, the piezoelectric element 20 and the vibration plate 13 both return to their original configurations. Accordingly, the cavity 15 also returns to its original volume, such that the pressure of the liquid inside the cavity 15 rises, and a droplet 22 of the liquid is jetted from the nozzle 18.

It is noted that, as a jetting means for the discharge head, systems other than the electromechanical conversion system using the aforementioned piezoelectric element (piezoelectric device) 20 may be adopted. For example, a system that uses an electro-thermo conversion element as an energy generation element, an electrostatic control type, a pressure-vibration type and other continuous systems, an electrostatic absorbing system, and a system in which electromagnetic wave such as laser is irradiated to generate heat, and liquid is jetted by an action caused by the heat generation, may be used.

First Electrode Forming Process

First, as shown in FIG. 4(a), a liquid containing metal fine particles is deposited at a desired position on the substrate 53 (on the interlayer dielectric film 52), in other words, on the embedded wiring 5 by using a droplet discharge method (ink jet method) using the discharge head 34 described above. The metal fine particles contained in the liquid, in other words, metal fine particles of the material for forming the first electrode 2 may be one kind or plural kinds selected from platinum, indium, ruthenium, gold and silver, and the metal fine particles are dispersed in a dispersion medium thereby being adjusted as a liquid. The sizes of the metal fine particles may preferably be 50 nm or greater but 0.1 μm or less, and by setting them in this range, they can be readily dispersed in the dispersion medium, and the jetting property as they are jetted from the discharge head 34 becomes excellent. It is noted that the surfaces of the metal fine particles may be coated with an organic substance or the like in order to improve the dispersion property thereof in the dispersion medium.

The dispersion medium for dispersing the metal fine particles may preferably have a vapor pressure at room temperature between 0.001 mmHg and 200 mmHg. If the vapor pressure of the dispersion medium is greater than 200 mmHg, the dispersion medium is instantly vaporized when a coated film is formed through ejection, which may make the forming of a preferable coating film difficult. On the other hand, if the vapor pressure of the liquid dispersion medium is less than 0.001 mmHg, the dispersion medium may remain in the coated film because drying takes a long time, and a high-quality conductive film may not be obtained after the heat and/or optical treatment in a later step. Also, in particular, the vapor pressure of the liquid dispersion medium may preferably be 50 mmHg or less, because the nozzles may not easily become clogged due to drying in the case in which liquid droplets are ejected from the discharge heads 34, and stable ejection becomes possible.

The solvent to be used is not limited to a specific type as long as it is possible to disperse the aforementioned metal fine particles without causing aggregation. More specifically, the solvent may be, for example, besides water, an alcohol group such as methanol, ethanol, propanol, or butanol; a hydrocarbon solvent such as n-heptane, n-octane, decane, toluene, xylene, cymene, durene, indene, dipentene, tetrahydronaphthalene, decahydronaphthalene, or cyclohexylbenzene; an ether solvent such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1,2-dimethoxyethane, bis (2-methoxyethyl) ether, or p-dioxane; or a polar solvent such as propylene carbonate, γ-butyrolactone, N-methyl-2-pyrrolidone, dimethyl formamide, dimethyl sulfoxide, or cyclohexanone. In the above group, water, an alcohol group, a hydrocarbon solvent, and an ether solvent are preferred, and more preferred solvents are water and a hydrocarbon dispersion medium in view of the dispersion performance of the metal fine particles, stability of the dispersion liquid, and ease of application to the ink-jet method. Of these dispersion mediums, one medium may be used alone, or a mixture of two or more mediums may be used.

When the metal fine particles are dispersed in a dispersion medium to form a dispersion liquid, the concentration of the metal fine particles in the dispersion liquid may preferably be set in a range between 1 weight % and 80 weight %, and it may preferably be adjusted within this range depending on the film thickness of the metal film (first electrode 2) to be formed. It is noted that when the concentration exceeds 80 weight %, aggregation of metal fine particles tends to occur, and it is difficult to obtain a uniform coated film. If the concentration is less than 1 weight %, it takes a long time for drying to evaporate the dispersion medium, and the productivity lowers.

It is noted that a vary small amount of a surface tension modifier such as a fluorine system, silicone system, or nonion system may preferably be added to the dispersion liquid containing metal fine particles to an extent that does not damage the targeted functions.

The surface tension modifier of a nonion system improves wettability of the dispersion liquid with respect to the target coating object, improves the leveling property of the coated film, and contributes to the prevention of spots and small irregularities in the coated film. The viscosity of the dispersion liquid containing metal fine particles that is adjusted by adding the surface tension modifier of a nonion system may preferably be set in a range between 1 mPa·s and 50 mPa·s. When the viscosity is less than 1 mPa·s, portions around the nozzles of the droplet discharge head 34 tend to become dirty due to discharged liquid flowing out, and when the viscosity is greater than 50 mPa·s, the nozzles may frequently become clogged.

Furthermore, the surface tension of the dispersion liquid containing metal fine particles thus adjusted may preferably be set in a range between 20 dyn/cm and 70 dyn/cm. When the surface tension is less than 20 dyn/cm, the trajectory of the liquid tends to curve because the wettability of the ink composition with respect to the nozzle surface is increased, and when the surface tension exceeds 70 dyn/cm, it is difficult to control the amount of ejection and the timing of ejection of the ink composition because the shape of the meniscus at the nozzle end is not stable.

Figure 4:
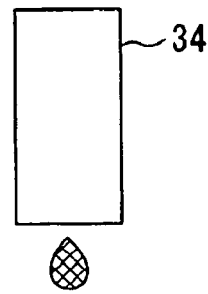
FIGS. 4(a)–(d) are side cross-sectional views for describing a method for manufacturing a capacitor.
Figure 4:
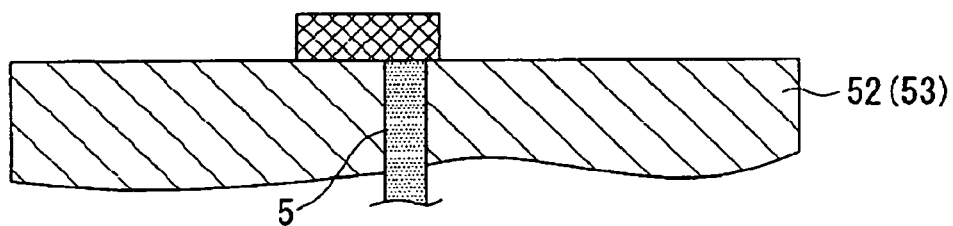
Figure 4:
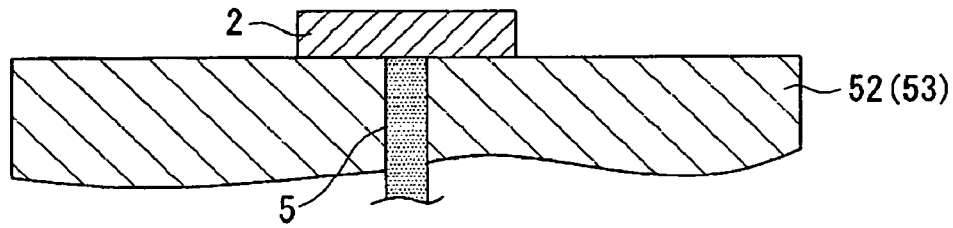
Figure 4:
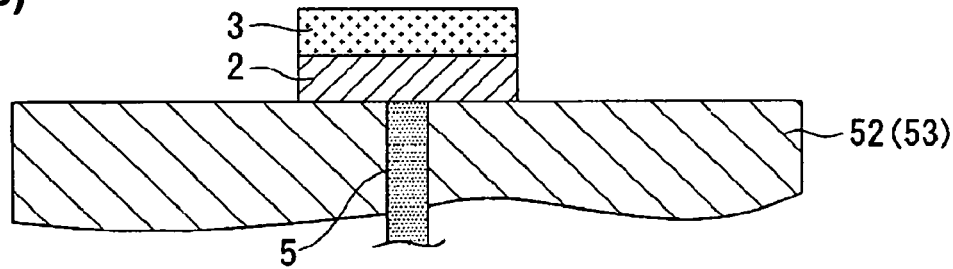
Figure 4:
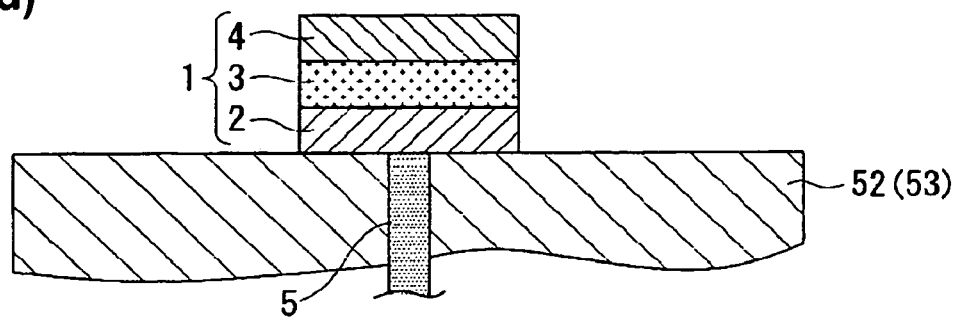

The dispersion liquid containing metal fine particles is deposited at a desired position on the interlayer dielectric film 52 by the discharge head 34, and when a predetermined pattern is coated with the dispersion liquid containing metal fine particles, the substrate 53 is heated to conduct a heat treatment on the dispersion liquid containing metal fine particles. As a result, the dispersion medium is removed from the dispersion liquid containing metal fine particles, and further the metal fine particles are sintered, such that the first electrode 2 with the fine particles having sufficiently preferred electrical contacts is formed, as shown in FIG. 4(*b*).

The heat treatment may not be limited to any specific conditions, and ordinary conditions can be used. For example, the heat treatment may be performed under a normal atmosphere as the heat treatment atmosphere, or in an inert gas atmosphere such as nitrogen, argon, or helium, if necessary. The temperature at which the heat treatment is performed is appropriately determined taking into consideration the boiling point (vapor pressure) of the dispersion medium, pressure, and the thermal behavior of the metal fine particles, but in particular, may preferably be 400° C. or less. By setting the temperature at 400° C. or less, when other semiconductor elements, Al wirings, and protection layers and insulation layers composed of resin are formed on the substrate 53, thermal influences thereon can be sufficiently reduced.

The heat treatment may be performed by a conventional heating process using, for example, a hot plate, an electric furnace, or the like. Other than such a conventional heating process, it can be performed by a lamp annealing process. For example, when the heat treatment is conducted with a hot plate or an electric furnace, the heat treatment temperature may be, for example, 300° C., and the treatment time may be 30 minutes. When the first electrode 2 is formed under such conditions, the first electrode 2 to be obtained has, for example, a thickness of about 0.1 μm.

Also, the light source for the lamp annealing process is not limited, and an infrared lamp, a xenon lamp, a YAG laser, an argon laser, a carbon dioxide laser, an excimer laser such as XeF, XeCl, XeBr, KrF, KrCl, ArF, ArCl, or the like may be employed. In general, the output power of such a light source is set to be in a range between 10 W and 5000 W, and in the case of the present embodiment, 100 W to 1000 W may be sufficient.

Insulation Film Forming Process

Next, as precursor materials of $SrTiO_3$ to be formed, each of the constituting metals of this oxide, in other words, metal alkoxides or metal salts such as carbonates containing Sr and Ti are prepared for each metal element. Also, a compound such as oxide including at least one of Si and Ge is prepared separately from them. Then, these metal compounds are mixed such that a mole ratio of Sr and Ti becomes 1:1. Also, as for Si and Ge, the compound is also mixed such that they are contained in an insulation film that is finally obtained in a total amount in a range between 0.1 mol % and 10.0 mol %. When a metal compound including Sr or Ti is used as the oxide of Si and/or Ge, the metal compound needs to be added such that the amount of Sr or the amount of Ti does not damage the aforementioned condition, in other words, the condition in which the mole ratio of Sr to Ti becomes 1:1. It is noted that the precursor compounds thus mixed may preferably be adjusted into a liquid in a sol state, by adding an appropriate solvent or dispersion medium such as an alcohol to provide physical properties suited for discharging by a droplet discharge method.

Then, the liquid in a sol state thus adjusted is disposed (coated) by the discharge head 34 on the first electrode 2 into a uniform thickness.

Then, the liquid is dried for a predetermined time at a predetermined temperature, to thereby remove liquid contents from the liquid. Further, after this drying step, a degreasing step is conducted under a normal atmosphere at a predetermined high temperature (for example, 450° C.) for a predetermined time (for example, 30 minutes), thereby thermally decomposing organic components coordinated with metals, and oxidizing the metals into metal oxides. Such coating→drying→degreasing steps are repeated a predetermined time, to form the metal oxides to a desired thickness.

Thereafter, a heat treatment is conducted in a RTA (Rapid Thermal Annealing) furnace while flowing oxygen at a predetermined temperature, for example, at 450° C. or less, more preferably, between 400° C. and 450° C., and even more preferably, at 450° C., thereby sintering the metal oxides to form the insulation film 3 to a thickness of about 0.2 μm on the first electrode 2, as shown in FIG. 4(*c*). By conducting the heat treatment at 450° C. or less, particularly when other semiconductor elements and wirings are formed on the substrate 53, thermal influences thereon can be reduced. It is noted that the heat treatment is not limited to the one with a RTA furnace.

When the insulation film 3 is formed with the liquid in a sol state in a manner described above, the liquid wet-spreads when jetted, and is difficult to form a desired configuration, in other words, a configuration that generally covers the entire first electrode 2.

Accordingly, prior to forming the insulation film 3 described above, a self-organizing film using, for example, fluoroalkylsilane may preferably be formed on a surface of the substrate 53 (interlayer dielectric film 52) where the first electrode 2 is formed, thereby forming a liquid-repelling portion that has a low affinity to the liquid in a sol state.

Liquid-Repelling Portion Forming Process

Figure 5:
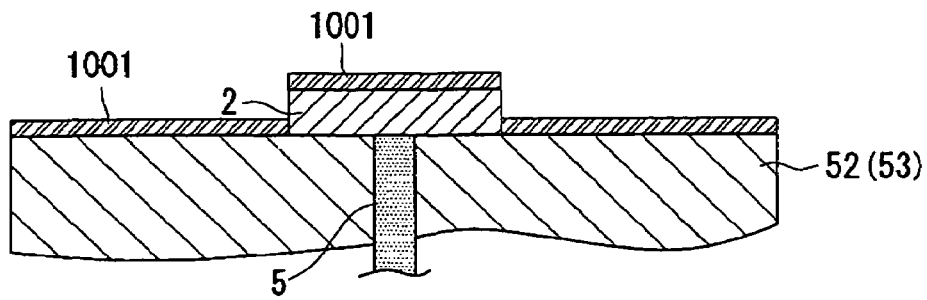
FIG. 5 is a side cross-sectional view for describing an example in which a liquid-repelling portion is formed.

To form the liquid-repelling portion, a self-organizing film 1001 composed of fluoroalkylsilane or the like to have a predetermined contact angle with respect to the liquid in a sol state is formed, as shown in FIG. 5, on the surface of the substrate 53, in other words, on the surface of the first electrode 2 and on the exposed surface of the interlayer dielectric film 52. The contact angle may preferably be 30 degrees or greater but 60 degrees or smaller.

An organic molecular film for treatment of the surfaces of the first electrode 2 and the interlayer dielectric film 52 includes a first functional group that can be bound with the surfaces, a second functional group for reforming the surface (i.e., controlling surface energy) of the substrate such as a group having liquid-affinity, a liquid-repellent group, or the like disposed at the side opposite to the first functional group, and a straight carbon chain or a partially branching carbon chain that binds the first and second functional groups together. The organic molecular film binds with the respective surfaces and self-organizes so as to form a molecular film such as a monomolecular film.

The self-organizing film 1001 herein referred to includes a functional group that is to react with constituent atoms of a backing layer that is the first electrode 2 and the interlayer dielectric film 52, and other straight chain molecules, and is formed by orienting compounds that have an extremely high orientation due to interaction between the straight chain molecules. Because the self-organizing film 1001 is formed by orienting single molecules, an extremely small film thickness can be obtained, and in addition, the film is quite uniform as observed on the scale of molecular size. Also, because the same type of molecules are positioned at the surface of the film, a uniform and superior liquid-repellency or liquid-affinity may be provided on the surface of the film.

As the compound having a high orientation, in other words, as the compound for forming the self-organizing film 1001, fluoroalkylsilane (FAS) is preferably used because it demonstrates a good bonding property with the substrate 53 and contributes to good liquid-repellency. By using fluoroalkylsilane, each of the compounds is oriented such that each fluoroalkyl group thereof is positioned at the surface of the film so that the self-organizing film 1001 is formed, and thus a uniform liquid-repellency is provided on the surface of the film.

As the fluoroalkylsilane described above, for example, heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, or trifluoropropyltrimethoxysilane may preferably be used. Of these compounds, one compound (FAS) may be used alone, or two or more compounds (FAS) may be combined and used.

To form the self-organizing film 1001, the above-mentioned source compounds (FAS) and the substrate 53 are placed in a sealed container. After leaving them to stand for 2 to 3 days at room temperature, the self-organizing film 1001 is formed on the substrate 53. Alternatively, by maintaining the entire sealed container at 100° C., the self-organizing film 1001 is formed on the substrate 53 in approximately 3 hours.

Also, instead of the forming method using a gas phase, the self-organizing film 1001 may be formed from a liquid phase. For example, the self-organizing film 1001 can be formed on a substrate through the steps of dipping the substrate in a solution containing the source compounds, and rinsing and drying the substrate.

It is noted that, before forming the self-organizing film 1001, a pretreatment may preferably be applied to the surface of the substrate through irradiating ultraviolet light to the surface of the substrate, or cleaning the surface of the substrate using a solvent.

In this manner, by making the surface of the first electrode 2 and the surface of the interlayer dielectric film 52 liquid-repellent, and in particular, by making the liquid in a sol state disposed on the surface of the first electrode 2 difficult to wet-spread, the liquid is prevented from spreading into the surface of the interlayer dielectric film 52 and forming a film there, such that the insulation film 3 obtained can be prevented from substantially differing from the desired configuration.

It is noted that, to form the insulation film 3 in a desired configuration, in other words, in a configuration that generally entirely covers the first electrode 2, a liquid-repelling portion may be formed on the surface of the interlayer dielectric film 52 (substrate 53) at least around the first electrode 2. Further, the surface of the first electrode 2 may preferably be formed as a lyophilic portion (a portion having a high affinity to the liquid in a sol state), instead of forming it as a liquid-repelling portion.

To make the surface of the first electrode 2 to be a lyophilic portion, ultraviolet light or the like is irradiated to the self-organizing film 1001 through a mask (not shown) having a desired pattern, in other words, an opening pattern corresponding to the surface configuration of the first electrode 2 formed therein. As a result, the self-organizing film 1001 in a region irradiated with ultraviolet light is removed, and for example, a hydroxyl group is exposed on the surface, which becomes a lyophilic portion that exhibits a very high wettability compared to the FAS region.

Also, a second self-organizing film may be formed in the above-described region where the FAS is removed. A compound for forming the second self-organizing film also includes a functional group for bonding and a functional group for reforming the surface, like FAS, wherein the functional group for bonding bonds with the hydroxyl group or the like at the substrate surface, to form the self-organizing film. However, the functional group of the second self-organizing film for reforming the surface may be the one that exhibits, unlike FAS, a lyophilic property, or has a strong bonding force with metal fine particles, such as, for example, an amino group or a thiol group. By forming the second self-organizing film described above, the liquid in a sol state can be more securely disposed on the first electrode 2, and the insulation film 3 in a desired configuration can be formed. Also, the bonding force of the obtained insulation film 3 to the first electrode 2 is enhanced. As the compounds for forming the second self-organizing film described above, 3-mercaptopropyltriethoxysilane, 3-mercaptopropyltrimethoxysilane, 3-aminopropyltriethoxysilane, 3-aminopropyltrimethoxysilane, and the like can be enumerated.

Second Electrode Forming Process

When the portion up to the insulation film 3 is formed in the manner described above, then a second electrode 4 is formed on the insulation film 3, as shown in FIG. 4(d). The second electrode 4 can be formed by generally the same forming method as the method for forming the first electrode 2 described above. In other words, by a droplet discharge method (an ink jet method) using the discharge head 34 described above, a liquid containing metal fine particles is deposited on the insulation film 3, and then a heat treatment is conducted to sinter the metal fine particles, to form the second electrode 4. Through the above processes, the capacitors 1 (1a, 1b) can be obtained.

As the metal fine particles contained in the liquid, in other words, the metal fine particles that are materials for forming the second electrode 4, one type or plural types kinds selected from platinum, iridium, ruthenium, gold and silver may be used, like in the case of the first electrode 2. Also, the heat treatment may preferably be conducted, in particular, at 400° C. or less.

It is noted that, prior to forming the second electrode 4, a liquid-repelling portion forming step, which is conducted as a pretreatment before the insulation film 3 is formed, may be conducted. More specifically, a liquid-repelling portion composed of fluoroalkylsilane (FAS), like the one described above, is formed on the surface of the insulation film 3 and the surface of the interlayer dielectric film 52, thereby selectively forming the second electrode 4 on the insulation layer 3 while preventing the liquid from wet-spreading. Also, prior to forming the first electrode 2 described above, a liquid-repelling portion may be formed on the surface of the substrate 53 (interlayer dielectric film 52). Further, when a liquid-repelling portion is formed as a pretreatment before forming each of the electrodes 2 and 4, portions where the liquid is directly applied may be changed to lyophilic portions by irradiation of ultraviolet light or the like, as described above.

Also, the first electrode 2 and the second electrode 4 may be formed by using a vapor deposition method, a sputter method or the like, instead of using the droplet discharge method as a method for forming thereof.

When the second electrode 4 is formed, wirings that are connected to the second electrode 4, and a protection film and an insulation film that cover them are formed, whereby the semiconductor device 50 is obtained.

According to the capacitor 1 thus obtained, the insulation film 3 having $SrTiO_3$ as a main component has a relatively high dielectric constant, and therefore the capacitor 1 equipped with the same can have a higher capacity compared to a conventional type, and can be made smaller when it is designed to have the same capacity as that of a conventional type. Also, because $SrTiO_3$ does not have a phase change at temperatures at which capacitors are normally used, for example, from minus (−) several tens ° C. to plus (+) one hundred and several tens ° C., its dielectric constant has few fluctuations, and therefore it is highly reliable and can be stably operated. Furthermore, because the insulation film 3 does not contain Pb, it is advantageous against environmental pollution, and the capacitor 1 equipped with the same is also environmentally advantageous.

Also, because the insulation film 3 contains at least one of Si and Ge added thereto, the sintering temperature at the time of forming the insulation film 3 becomes lower as Si or Ge acts as catalyst. Accordingly, when the substrate 53 on which the capacitor 1 is to be formed includes, for example, other semiconductor elements and wirings formed thereon, thermal influences thereon can be minimized.

Furthermore, according to the method for manufacturing the capacitor 1, due to the fact that the liquid in a sol state is deposited by a droplet discharge method, and the same is thermally treated to form the insulation film 3, a large-scale film forming apparatus is not required, and the method is advantageous also in material usage efficiency and energy consumption, such that the cost can be reduced. Moreover, because patterning by etching is not required as the liquid can be deposited at any desired positions, the insulation film 3 can be made free of damage which may be caused by etching, and its characteristic can be improved. Furthermore, because the insulation film 3 having a high dielectric constant can be formed, as described above, the capacitor 1 can be provided with a higher capacity, or can be miniaturized.

Moreover, in the semiconductor device 50 that is equipped with the capacitor 1 described above, the capacitor 1 has the insulation film 1 of a high dielectric constant, and therefore can be reduced in size, such that the semiconductor device 50 itself can also be reduced in size. Also, in particular, because the insulation film 3 is formed by using a liquid discharge method, the cost can be reduced. Furthermore, because the insulation film 3 of the capacitor 1 does not contain Pb, it is advantageous against environmental pollution, and therefore the semiconductor device itself equipped with the same also becomes environmentally advantageous.

EMBODIMENT EXAMPLES

Next, the present invention is described more concretely by referring to embodiment examples.

In the embodiment examples, a capacitor 1 shown in FIG. 1 is manufactured based on the manufacturing method indicated in FIGS. 4(a)–(d).

First, a liquid containing platinum (Pt) fine particles dispersed therein was jetted by a droplet discharge method using the discharge head 34 onto a predetermined position on the interlayer dielectric film 52 composed of polyimide on the substrate 53, and a heat treatment was conducted using a hot plate at 300° C. for 30 minutes, whereby a first electrode 2 was formed in a thickness of about 0.1 μm.

Next, a liquid-repellent process with fluoroalkylsilane (FAS) was applied to the surface of the substrate 53 (interlayer dielectric film 52) that includes the first electrode 2.

Then, a liquid containing the precursor compounds of $SrTiO_3$ was disposed by a droplet discharge method using the discharge head 34. As the precursor compounds, metalalkoxides of the respective metals, i.e., Sr and Ti were used, and they were mixed such that these metals were in a predetermined mole ratio, and adjusted into a liquid in a sol state. Also, a Si compound such as Si oxide was prepared for the purpose of adding Si, and the compound was added in the liquid such that a Si (silicon) content becomes 2 mol %.

Then, drying and degreasing steps were conducted on the liquid disposed on the first electrode 2. The steps of coating→drying→degreasing the liquid were repeated a predetermined time, and then a heat treatment was conducted at various temperatures in an RTA furnace while flowing oxygen to sinter the compounds, thereby forming an insulation film 3 on the first electrode 2 to a thickness of about 0.2 μm.

Then, a liquid containing platinum (Pt) fine particles dispersed therein was jetted by a droplet discharge method on the insulation film 3, and a heat treatment was conducted, thereby forming a second electrode 4 composed of a Pt film like the first electrode 2 to a thickness of about 0.1 μm, whereby the capacitor 1 was obtained.

To confirm characteristics of the capacitor 1 thus obtained, the following experiments were conducted.

Experiment Example 1

With respect to Embodiment Example described above, the relation between the sintering temperature of the liquid for forming SrTiO3 that is added with the material for forming the insulation film 3, in other words, the Si compound so that the silicon content becomes 2 mol % and the dielectric constant ε of the insulation film 3 obtained was examined. The results obtained are shown in FIG. 6.

Figure 6:
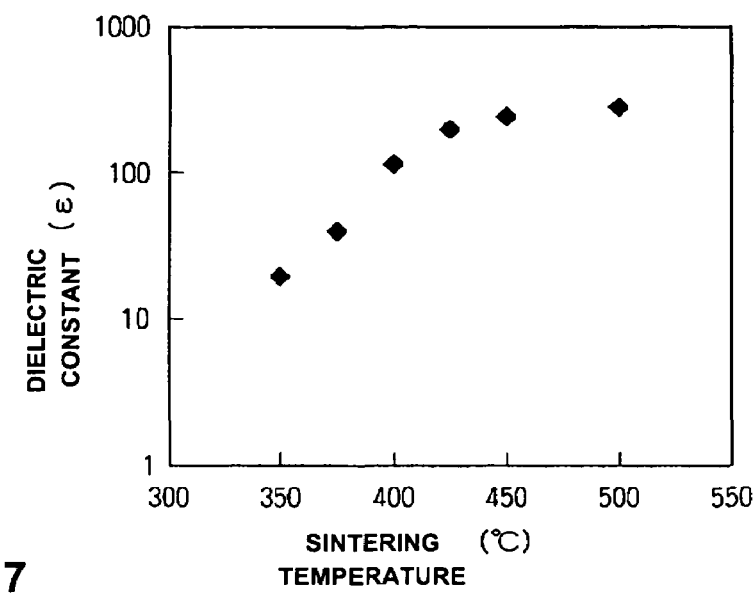
FIG. 6 is a graph showing the relation between the sintering temperature and the dielectric constant of insulation films obtained.

It is observed from FIG. 6 that, even when the sintering temperature is low at 450° C., the dielectric constant ε is about 250 which is close to a bulk value. It is believed that the reason why such a high dielectric constant is obtained at such a low sintering temperature is that the insulation film is in a mixed phase in which crystal phases are dispersed in an amorphous phase. Also, it is believed that at least one of Si and Ge (Si in the present experiment example) that was added acted as catalyst, and the crystal phase could be obtained at a low sintering temperature. According to TEM observation, the presence of the crystal phase was confirmed.

On the other hand, when the sintering temperature was set at 500° C., a high dielectric constant was obtained. The insulation film obtained at this high temperature sintering exhibited a perovskite phase according to X-ray analysis results, and was therefore crystallized. It is therefore believed that it shows a high dielectric constant.

Accordingly, in accordance with the present invention, the sintering temperature may preferably be set at 450° C. or less, and more preferably, 400° C.–450° C. By controlling the sintering temperature in this manner, the dielectric constant of an insulation film to be obtained can be controlled.

It is noted that, when the same experiment was conducted with Ge added instead of Si, results similar to Experiment Example 1 were obtained. Further, when the same experiment was conducted with Si and Ge added, similar results were also obtained.

Experiment Example 2

Figure 7:
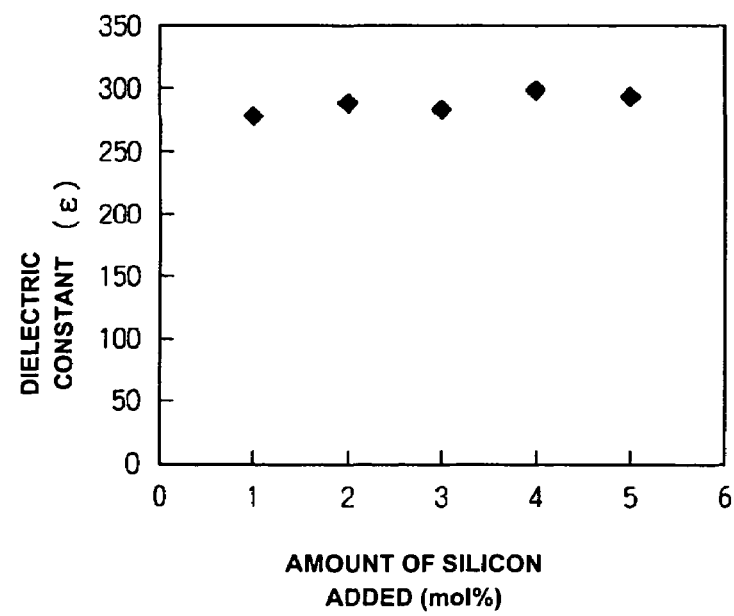
FIG. 7 is a graph showing the relation between the amount of silicon added and the dielectric constant.

With respect to Embodiment Example described above, liquids that are used for forming the insulation film 3 containing $SrTiO_3$ as a main composition were prepared, while adjusting the mole ratio of Si added in the form of a Si compound to change from 0 mol % to 5 mol %. Then, plural kinds of insulation films were formed by using these liquids, and the dielectric constant (ε) of each of the insulation films formed was examined. The results obtained are shown in FIG. 7 as the relation between the amount of Si (silicon) added (mol %) and the dielectric constant (ε). It is noted that the sintering temperature was 450° C.

Although an insulation film formed without adding Si had a dielectric constant of about 50, it is observed from FIG. 7 that, when Si was added only by 1 mol %, the dielectric constant exceeded 200. Also, it is observed that the dielectric constant showed almost no change even when the adding amount was increased, and the characteristic was saturated.

In this manner, even with a small adding amount of, for example, 1 mol %, the dielectric constant drastically changes. Accordingly, it is believed that Si acted as catalyst at the time of sintering as described above, and the crystal phase could be obtained even at a low temperature.

From the results above, it is found that, by adding Si, a high dielectric constant can be obtained even at a low temperature at 450° C. or less, and the leakage characteristic is also improved.

Also, it is found that those with Si being added have small changes in the dielectric constant against temperature changes and frequency changes, compared to those without Si being added, which is generally constant in a range between −30° C. and +100° C., and in a range between 1 kHz and 1 MHz.

It is noted that, when the same experiment was conducted with Ge added instead of Si, results similar to Experiment Example 2 were obtained. Further, when the same experiment was conducted with Si and Ge added, similar results were also obtained.

Also, the use of iridium (Ir), ruthenium (Ru), gold (Au) or silver (Ag) instead of platinum (Pt) as the electrode provided similar results.

Further, in order to obtain a greater capacity, electrode films and insulation films may be alternately laminated to form a capacitor.

As described above, a capacitor in accordance with the present invention includes an insulation film that has a relatively high dielectric constant. Accordingly, by using the same as a capacitor inside a circuit in place of a conventional type, a semiconductor device to be obtained can achieve a higher performance and a size-reduction. Also, by using the same as a capacitor attached external to a circuit, a higher performance and a size-reduction of a semiconductor device can also be achieved. Furthermore, although the required capacities of capacitors to be used inside a circuit and attached external to a circuit may be different, the dielectric constants of insulation films to be obtained can be controlled by controlling the adding amount of Si and Ge, and the sintering temperature. Therefore, capacitors in accordance with the present invention can be applied to both of the types. It is noted that, when the sintering temperature is used for control, one requiring a higher sintering temperature may preferably be formed first.

Also, because $SrTiO_3$ does not have a phase change at temperatures at which capacitors are normally used, for example, from minus (−) several tens ° C. to plus (+) one hundred and several tens ° C., its dielectric constant has few fluctuations, and therefore it is highly reliable and can be stably operated. Furthermore, because its insulation film does not contain Pb, it is advantageous against environmental pollution, and capacitors equipped with the same can be environmentally advantageous.

Also, in particular, by forming them by a droplet discharge method, different types can be individually formed on the same plane. Accordingly, capacitors used inside circuits and capacitors attached externally to circuits of conventional types described above can be readily manufactured at low costs.

What is claimed is:

1. A capacitor comprising:

an insulation film interposed between a first electrode and a second electrode;

wherein the insulation film includes $SrTiO_3$ as a main component, and at least one of Si and Ge;

the insulation film is a mixed state of an amorphous phase and a crystal phase; and the crystal phase is formed in a state of being discontinuous and not in a state of being continuous between the first electrode and the second electrode.

2. The capacitor according to claim 1, wherein a total amount of the at least one of Si and Ge is 0.1 mol % or greater but 10.0 mol % or less.

3. The capacitor according to claim 1, wherein the insulation film is in at least one of:

an amorphous phase; and a mixed state of an amorphous phase and a crystal phase.

4. A semiconductor device comprising the capacitor recited in claim 1.

* * * * *